(12) United States Patent
Falk et al.

(10) Patent No.: US 12,444,615 B2
(45) Date of Patent: Oct. 14, 2025

(54) FORMING A DOPED HARDMASK

(71) Applicant: Applied Materials, Inc., Santa Clara, CA (US)

(72) Inventors: Scott Falk, Essex, MA (US); Rajesh Prasad, Lexington, MA (US); Sarah Michelle Bobek, Sunnyvale, CA (US); Harry Whitesell, Sunnyvale, CA (US); Kurt Decker-Lucke, Santa Clara, CA (US); Kyu-Ha Shim, Santa Clara, CA (US); Adaeze Osonkie, Beverly, MA (US); Tomohiko Kitajima, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 472 days.

(21) Appl. No.: 17/965,727

(22) Filed: Oct. 13, 2022

(65) Prior Publication Data

US 2024/0021433 A1    Jan. 18, 2024

Related U.S. Application Data

(60) Provisional application No. 63/368,678, filed on Jul. 18, 2022.

(51) Int. Cl.
| | | |
|---|---|---|
| H01L 21/3115 | (2006.01) | |
| C23C 16/26 | (2006.01) | |
| C23C 16/56 | (2006.01) | |
| H01L 21/033 | (2006.01) | |
| H01L 21/266 | (2006.01) | |
| H01L 21/308 | (2006.01) | |
| H01L 21/311 | (2006.01) | |
| H01L 21/02 | (2006.01) | |

(52) U.S. Cl.
CPC ........ *H01L 21/31155* (2013.01); *C23C 16/26* (2013.01); *C23C 16/56* (2013.01); *H01L 21/0332* (2013.01); *H01L 21/0337* (2013.01); *H01L 21/266* (2013.01); *H01L 21/3086* (2013.01); *H01L 21/31105* (2013.01); *H01L 21/31116* (2013.01); *H01L 21/02115* (2013.01)

(58) Field of Classification Search
None
See application file for complete search history.

(56) References Cited

U.S. PATENT DOCUMENTS

| | | |
|---|---|---|
| 6,297,098 B1 | 10/2001 | Lin et al. |
| 2006/0145095 A1 | 7/2006 | Olson et al. |
| 2008/0078950 A1 | 4/2008 | Buonodono et al. |
| 2008/0078953 A1 | 4/2008 | Gupta et al. |
| 2020/0357640 A1* | 11/2020 | Prasad .............. H01L 21/02321 |

* cited by examiner

*Primary Examiner* — Jiong-Ping Lu
(74) *Attorney, Agent, or Firm* — Patterson + Sheridan, LLP

(57) ABSTRACT

Methods for depositing a hardmask with ions implanted at different tilt angles are described herein. By performing ion implantation to dope an amorphous carbon hardmask at multiple tilt angles, an evenly distributed dopant profiled can be created. The implant tilt angle will determine a dopant profile that enhances the carbon hardmask hardness.

13 Claims, 10 Drawing Sheets

FORMING A DOPED HARDMASK

RELATED APPLICATIONS

This application claims benefit from U.S. Provisional Application Ser. No. 62/584,794, filed Nov. 11, 2017, which is incorporated by reference in its entirety.

BACKGROUND

Field

Implementations described herein generally relate to the fabrication of integrated circuits. More particularly, the implementations described herein provide techniques for deposition of amorphous carbon hardmasks on a substrate utilizing multiple tilt angles.

Description of the Related Art

Integrated circuits have evolved into complex devices that can include millions of transistors, capacitors and resistors on a single chip. The evolution of chip designs continually involves faster circuitry and greater circuit density. The demands for faster circuits with greater circuit densities impose corresponding demands on the materials used to fabricate such integrated circuits. In particular, as the dimensions of integrated circuit components are reduced to the sub-micron scale, low resistivity conductive materials as well as low dielectric constant insulating materials are used to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers deposited on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist is correspondingly reduced in order to control pattern resolution. Such thin resist layers can be insufficient to mask underlying material layers during the pattern transfer process due to attack by the chemical etchant. An intermediate layer (e.g., silicon oxynitride, silicon carbine or carbon film), called a hardmask, is often used between the energy sensitive resist layer and the underlying material layers to facilitate pattern transfer because of greater resistance to the chemical etchant. Hardmask materials having both high etch selectivity and high deposition rates are desirable. As critical dimensions (CD) decrease, current hardmask materials lack the targeted etch selectivity relative to underlying materials (e.g., oxides and nitrides) and are often difficult to deposit.

Therefore, there is a need in the art for an improved hardmask layer and methods for depositing improved hardmask layers.

SUMMARY

In one embodiment, a method of forming a doped amorphous carbon hardmask is provided. The method includes depositing an amorphous carbon hardmask on an underlayer positioned on a substrate and performing two or more ion implant processes to dope the amorphous carbon hardmask with a dopant to form the doped amorphous carbon hardmask. At least two of the ion implant processes are performed at different tilt angles and the tilt angles are defined between an axis extending in a normal direction from a top surface of a platen and a direction of an ion beam developed by the ion implant processes. The method further includes patterning the doped amorphous carbon hardmask with a photoresist and etching the underlayer through the doped amorphous carbon hardmask.

In another embodiment, a method of forming a doped patterned amorphous carbon hardmask is provided. The method includes depositing an amorphous carbon hardmask on an underlayer positioned on a substrate, patterning the amorphous carbon hardmask with a photoresist to form a patterned amorphous carbon hardmask, and performing two or more ion implant processes to dope the patterned amorphous carbon hardmask with a dopant to form the doped patterned amorphous carbon hardmask. At least two of the ion implant processes are performed at different tilt angles and the tilt angles are defined between an axis extending in a normal direction from a top surface of a platen and a direction of an ion beam developed by the ion implant processes. The method further includes etching the underlayer through the doped amorphous carbon hardmask.

In yet another embodiment, a method of forming a doped patterned amorphous carbon hardmask is provided. The method includes depositing an amorphous carbon hardmask on an underlayer positioned on a substrate, patterning the amorphous carbon hardmask with a photoresist to form a patterned amorphous carbon hardmask, and doping the patterned amorphous carbon hardmask by performing a first ion implant process of a first dopant into the amorphous carbon hardmask at a first tilt angle and performing a second ion implant processes of a second dopant into the amorphous carbon hardmask at a second tilt angle that is different than the first tilt angle. The first and second tilt angles are defined between an axis extending in a normal direction from a top surface of a platen and a direction of an ion beam developed by the first and the second ion implant processes. The method further includes etching the underlayer through the doped patterned amorphous carbon hardmask.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, and may admit to other equally effective implementations.

Figure 1:
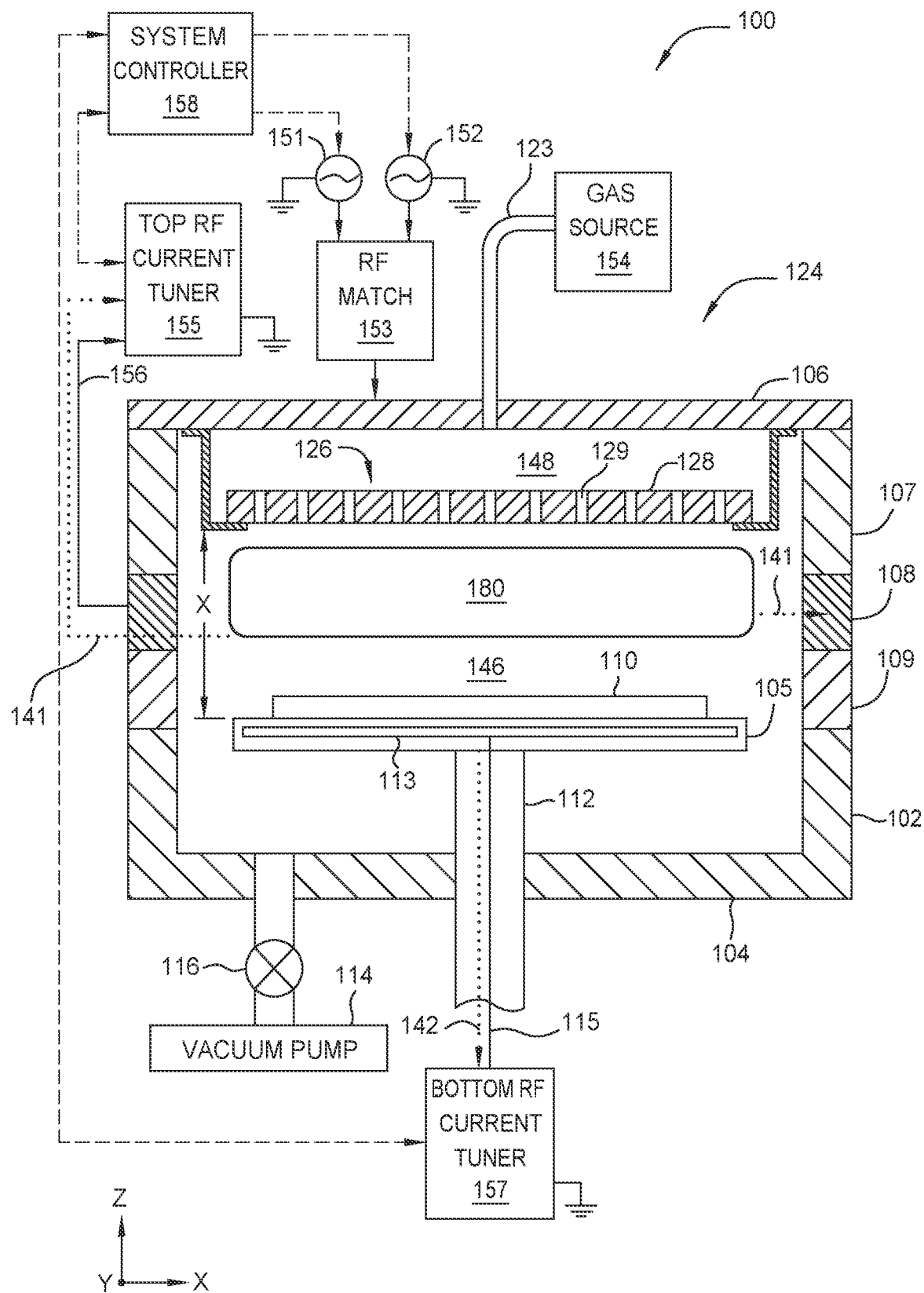
FIG. 1 is a schematic cross sectional view of a plasma-processing chamber according to implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes techniques for deposition of amorphous carbon hardmasks on a substrate. Certain details are set forth in the following description and in FIGS. 1-5H to provide a thorough understanding of various implementations of the disclosure. Other details describing well-known structures and systems often associated with plasma-processing and ion implantation are not set forth in the following disclosure to avoid unnecessarily obscuring the description of the various implementations. Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a plasma-enhanced chemical vapor deposition (PECVD) deposition process and a directional ion implantation process that can be carried out using any suitable thin film deposition and directional ion implant systems. The directional ion implantation process may be performed by a beam line or other plasma implantation tools that direct ions from an ion source in a predefined direction. Other tools capable of performing PECVD and/or directional ion implantation processes may also be adapted to benefit from the implementations described herein. In addition, any system enabling the PECVD and/or directional ion implant processes described herein can be used to advantage. The apparatus description described herein is illustrative and should not be construed or interpreted as limiting the scope of the implementations described herein.

The physical constraints in scaling down of integrated circuits have resulted in extension of integrated circuits orthogonal to the planar wafer surface, i.e., high aspect ratio (HAR), three-dimensional utilization of device space. The nanofabrication strategies to accommodate dynamic etch selectivity and increasingly stringent fabrication tolerances have resulted in a library of hardmask (HM) materials, such as carbon films doped with silicon, titanium, tungsten or boron; as well as dielectric silicon oxide-nitride (ON/OP) films. In some examples, the carbon films are doped via a chemical vapor deposition (CVD) process. Used in combination, these materials offer advantages in etch selectivity and patterning down to the 1× node. Innovation in amorphous carbon hardmask materials improves the formation of high aspect ratio (HAR) benchmarks in device structures.

In contrast to other solutions, amorphous carbon is ashable, providing high selectivity with respect to underlying ON/OP hardmask films. Another benefit of amorphous carbon hardmasks is the corresponding optical properties of the amorphous carbon hardmasks, which are tunable to offer transparency to aligned patterned features, therefore eliminating the need of partial hard mask open process. However, current integrated hardware and processes for amorphous carbon hardmasks demonstrate comparatively poor mechanical properties relative to metal doped and dielectric hardmask counterparts. An aspect of this patent covers improvement in the mechanical and etch properties by trace metal doping, with sustained $O_2$ ashability. The highest etch selectivity for the current generation pure carbon films (e.g., nanocrystalline diamond, ultra-nanocrystalline diamond, diamond-like carbon, and physical vapor deposition carbon) is seen for films with high sp3 content, analogous to the hybridization of diamond. A long-standing high value problem in diamond like carbon hardmasks is the >1 GPa compressive film stress due to sp3 hybridized carbon, which limits patterning performance due to lithographic overlay and electrostatic chucking constraints.

Next generation 3D NAND products with 64×layer stack applications and aspect ratios of 100:1 demand thin films that allow patterning while resisting deformation and simultaneously demonstrating improved lithographic overlay. Diamond-like carbon films couple carbon species-specific etch selectivity with superior structural integrity. These diamond-like carbon films will remain competitive only if their mechanical properties, the harbinger of which is Young's modulus, can further improve at reduced stress and in-plane distortion ("IPD") values.

Improvement of film properties is achieved through ion-implantation, which increases the Young's modulus of the amorphous carbon film an additional from about 30 GPa to about 50 GPa while decreasing compressive stress from about −30 MPa to about +30 MPa for a hardmask with a thickness of 3 μm. In addition, the combination of PECVD and ion implantation delivered amorphous carbon hardmasks that achieved significantly lower in-plane distortion through the mechanism of global stress reduction (<3 nanometers overlay error) compared to the current generation of traditional carbon hardmasks. Ion implantation serves to diminish the stress component of the amorphous carbon hardmasks (e.g., from about −30 to about +30 MPa), further improve the Young's modulus (e.g., from about 30 to about 50 GPa) and make the in-plane distortion profile more centrosymmetric.

Ion implantation may be performed at a range of temperatures (e.g., from about −100 degrees Celsius to about 700 degrees Celsius, such as between 400 degrees Celsius and about 600 degrees Celsius). The resulting amorphous carbon hardmasks has shown an improvement in etch selectivity of 10%-40% compared to other hardmask films. In one implementation, which can be combined with other implementations described herein, a carbon ion implant process improves etch selectivity by about 20% to about 30%. The carbon ion is implanted with an implant energy of about 130 keV and an ion dosage (ions/cm$^2$) of about $1\times10^{15}$ at 500 degrees Celsius. In another implementation, which can be combined with other implementations described herein, an argon ion implant process improves etch selectivity by about 20% to about 30%. The argon ion is implanted with an implant energy of about 300 keV and an ion dosage (ions/cm$^2$) of about $1\times10^{15}$ at 500 degrees Celsius.

In some implementations of the present disclosure, amorphous carbon hardmasks were deposited via plasma enhanced chemical vapor deposition onto bare silicon blanket wafers. In some implementations, the carbon precursor is $C_3H_6$, with plasma profile and uniformity sustained by argon and helium gases. The scope of this work also encompasses use of $C_4H_8$, $C_2H_6$, $C_2H_4$, $C_2H_2$, $CO_2$ and $CF_4$, among others. High frequency RF for this application is 13.56 MHz. In some implementations, ion implantation is executed in a single-wafer processing tool. The species yielding high performance shown in the present disclosure may be an ashable ion, maintaining the pure carbon character of the films.

FIG. 1 is a schematic cross sectional view of a plasma-processing chamber 100 configured according to various implementations of the disclosure. By way of example, the implementation of the plasma-processing chamber 100 in FIG. 1 is described in terms of a PECVD system, but any other plasma-processing chamber may fall within the scope of the implementations, including other plasma deposition chambers or plasma etch chambers. The plasma-processing chamber 100 includes walls 102, a bottom 104, and a chamber lid 124 that together enclose a susceptor 105 and a processing region 146. The plasma-processing chamber 100 further includes a vacuum pump 114, a first RF generator 151, a second RF generator 152, an RF match 153, a gas source 154, a top RF current tuner 155, a bottom RF current tuner 157, and a system controller 158, each coupled externally to the plasma-processing chamber 100 as shown.

The walls 102 and the bottom 104 may comprise an electrically conductive material. Through one or more of the walls 102, a slit valve opening may be present that is configured to facilitate insertion of a substrate 110 into and removal of the substrate 110 from the plasma-processing chamber 100.

The vacuum pump 114 is coupled to the plasma-processing chamber 100 and is configured to adjust the vacuum level therein. As shown, a valve 116 may be coupled between the plasma-processing chamber 100 and the vacuum pump 114. The vacuum pump 114 evacuates the plasma-processing chamber 100 prior to substrate processing and removes process gas therefrom during processing through the valve 116. The valve 116 may be adjustable to facilitate regulation of the evacuation rate of the plasma-processing chamber 100.

The gas source 154 is coupled to the plasma-processing chamber 100 via a tube 123 that passes through the chamber lid 124. The tube 123 is fluidly coupled to a plenum 148 between a backing plate 106 and a gas distribution showerhead 128 included in the chamber lid 124. During operation, process gas introduced into the plasma-processing chamber 100 from the gas source 154 fills the plenum 148 and then passes through the gas passages 129 formed in the gas distribution showerhead 128 to uniformly enter the processing region 146. In alternative implementations, process gas may be introduced into the processing region 146 via inlets and/or nozzles (not shown) that are attached to the walls 102 in addition to or in lieu of the gas distribution showerhead 128.

The susceptor 105 may include any technically feasible apparatus for supporting a substrate during processing by the plasma-processing chamber 100, such as the substrate 110 in FIG. 1. In some implementations, the susceptor 105 is disposed on a shaft 112 that is configured to raise and lower the susceptor 105. In implementations in which the plasma-processing chamber 100 is a capacitively coupled plasma chamber, the susceptor 105 may be configured to contain an electrode 113. In such implementations, a metal rod 115 or other conductor is electrically coupled to the electrode 113 and is configured to provide a portion of a ground path for RF power delivered to the plasma-processing chamber 100. That is, the metal rod 115 enables RF power delivered to the plasma-processing chamber 100 to pass through the electrode 113 and out of the plasma-processing chamber 100 to ground.

In some implementations, the electrode 113 is also configured to provide an electrical bias from a DC power source (not shown) to enable electrostatic clamping of the substrate 110 onto the susceptor 105 during plasma processing. Together, the electrode 113 and the gas distribution showerhead 128 define the boundaries of the processing region 146 in which plasma is formed.

The first RF generator 151 is a radio frequency (RF) power source configured to provide high-frequency power at a first RF frequency to a discharge electrode 126 via the RF match 153. Similarly, the second RF generator 152 is an RF power source configured to provide high-frequency power at a second RF frequency to the discharge electrode 126 via RF match 153. The first RF generator 151 and the second RF generator 152 are configured to facilitate generation of a plasma between the discharge electrode 126 and the susceptor 105.

The discharge electrode 126 may include a process gas distribution element, such as the gas distribution showerhead 128 (as shown in FIG. 1), and/or an array of gas injection nozzles, through which process gases are introduced into the processing region 146. The discharge electrode 126, i.e., the gas distribution showerhead 128, may be oriented substantially parallel to the surface of the substrate 110, and capacitively couples plasma source power into the processing region 146, which is disposed between the substrate 110 and the gas distribution showerhead 128.

The RF match 153 is coupled between the first RF generator 151 and the powered electrode of the plasma-processing chamber 100, i.e., the gas distribution showerhead 128. The RF match 153 is also coupled between the second RF generator 152 and the powered electrode of the plasma-processing chamber 100. The RF match 153 is configured to match a load impedance (the plasma-processing chamber 100) to the source or internal impedance of a driving source (the first RF generator 151, the second RF generator 152).

Forming a portion of the walls 102 are an upper isolator 107, a tuning ring 108, and a lower isolator 109. The upper isolator 107 is configured to electrically isolate the tuning ring 108, which is formed from an electrically conductive material, from the backing plate 106, which in some implementations is energized with RF power during operation. Thus, upper isolator 107 is positioned between the backing plate 106 and the tuning ring 108, and prevents the tuning ring 108 from being energized with RF power via the backing plate 106. In some implementations, the upper isolator 107 is configured as a ceramic ring or annulus that is positioned concentrically about the processing region 146. Similarly, the lower isolator 109 is configured to electrically isolate the tuning ring 108 from the walls 102. The walls 102 are typically formed from an electrically conductive material, and can therefore act as a ground path for a portion of RF power delivered to the plasma-processing chamber 100 during processing. Thus, the lower isolator 109 enables the tuning ring 108 to be part of a different ground path for RF power delivered to the plasma-processing chamber 100 than that of the walls 102.

The tuning ring 108 is disposed between the upper isolator 107 and the lower isolator 109, is formed from an electrically conductive material, and is disposed adjacent the processing region 146. In addition, the tuning ring 108 is electrically coupled to ground via the top RF current tuner 155 via a conductor 156, as shown. That is, the shape, volume or uniformity of the plasma formed in the processing region 146 may be independently modulated for multiple RF frequencies across the surface of the substrate 110 by use, for example, of the tuning ring 108 or vertically between the substrate 110 and the gas distribution showerhead 128 using the electrode 113.

The system controller 158 is configured to control the components and functions of the plasma-processing chamber 100. As such, the system controller 158 receives sensor inputs, e.g., voltage-current inputs from the top RF current tuner 155 and the bottom RF current tuner 157, and transmits control outputs for operation of the plasma-processing chamber 100.

The top RF current tuner 155 is electrically coupled to the tuning ring 108 and is terminated to ground, thus providing a controllable RF ground path 141 for the plasma-processing chamber 100. Similarly, the bottom RF current tuner 157 is electrically coupled to the metal rod 115 and is terminated to ground, thus providing a different controllable RF ground path 142 for the plasma-processing chamber 100.

A plasma 180 is formed in the processing region 146 between the electrode 113 and the discharge electrode 126. A distance or "spacing" between the bottom surface of the electrode 113 and a top surface of the susceptor 105 is represented by "x".

Other deposition chambers may also benefit from the present disclosure and the parameters listed above may vary according to the particular deposition chamber used to form the amorphous carbon layer. For example, other deposition chambers may have a larger or smaller volume, requiring gas flow rates that are larger or smaller than those recited for deposition chambers herein.

The atomic percentage of dopant incorporation in the amorphous carbon film is calculated as follows: (dopant concentration in $cm^{-3}$ divided by the number of carbon atoms per $cm^{-3}$ expected for a carbon film of a particular density). The amorphous carbon hardmasks may contain from about 1 to about 30 atomic percentage of dopant. The amorphous carbon hardmasks may contain at least 3, 5, or 10 atomic percentage of hydrogen. The amorphous carbon hardmasks may contain from about 3 to about 15 atomic percentage of hydrogen.

In one implementation where the dopant is carbon, the atomic percentage of carbon incorporation in the amorphous carbon hardmask is calculated as follows: ((C/(H+C))%). The amorphous carbon hardmask may contain from about 85 to about 97 atomic percentage of carbon. The amorphous carbon hardmask may contain from about 3 to about 15 atomic percentage of hydrogen.

In general, the following exemplary deposition process parameters may be used to for the PECVD portion of the amorphous carbon hardmask deposition process described herein. The process parameters may range from a wafer temperature of about −100 degrees Celsius to about 700 degrees Celsius, such as between about 300 degrees Celsius to about 700 degrees Celsius, for example between 400 degrees Celsius and about 600 degrees Celsius. The chamber pressure may range from about 1 Torr to about 20 Torr (e.g., between about 2 Torr and about 10 Torr; or between about 5 Torr and about 8 Torr). The flow rate of the hydrocarbon-containing gas to each wafer may be from about 80 sccm to about 5,000 sccm (e.g., between about 100 sccm and about 2,000 sccm; or between about 100 sccm and about 400 sccm). The flow rate of a dilution gas may individually range from about 0 sccm to about 5,000 sccm (e.g., from about 2,000 sccm to about 4,080 sccm). The flow rate of an inert gas to each reactor may individually range from about 0 sccm to about 10,000 sccm (e.g., from about 0 sccm to about 2,000 sccm; from about 200 sccm to about 2,000 sccm). The RF power may be between 1,000 Watts and 6,000 Watts. The plate spacing between the top surface of the substrate 110 and the gas distribution showerhead 128 may be set to between about 200 mils to about 1,000 mils (e.g., between about 250 mils and about 600 mils; between about 300 mils to about 1,000 mils; or between about 400 mils and about 600 mils). The above process parameters provide a typical deposition rate for the amorphous carbon hardmask in the range of about 100 Å/minute to about 7,000 Å/minute (e.g., from about 1,400 Å/minute to about 3,200 Å/minute) and can be implemented on a 300 mm substrate.

The substrate 110 may comprise one or more metal layers, one or more dielectric materials, semiconductor material, and combinations thereof utilized to fabricate semiconductor devices. For example, the substrate 110 may include an oxide material, a nitride material, a polysilicon material, or the like, depending upon application. In one implementation where a memory application is targeted, the substrate 110 may include the silicon substrate material, an oxide material, and a nitride material, with or without polysilicon sandwiched in between. In another implementation, the substrate 110 may include a plurality of alternating oxide and nitride materials (i.e., oxide-nitride-oxide (ONO)) (not shown) deposited on the surface of the substrate 110. In various implementations, the substrate 110 may include a plurality of alternating oxide and nitride materials, one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or undoped amorphous silicon alternating with doped amorphous silicon. The substrate 110 may be any substrate or material surface upon which film processing is performed. For example, the substrate 110 may be a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low-k dielectrics, and combinations thereof.

Figure 2:
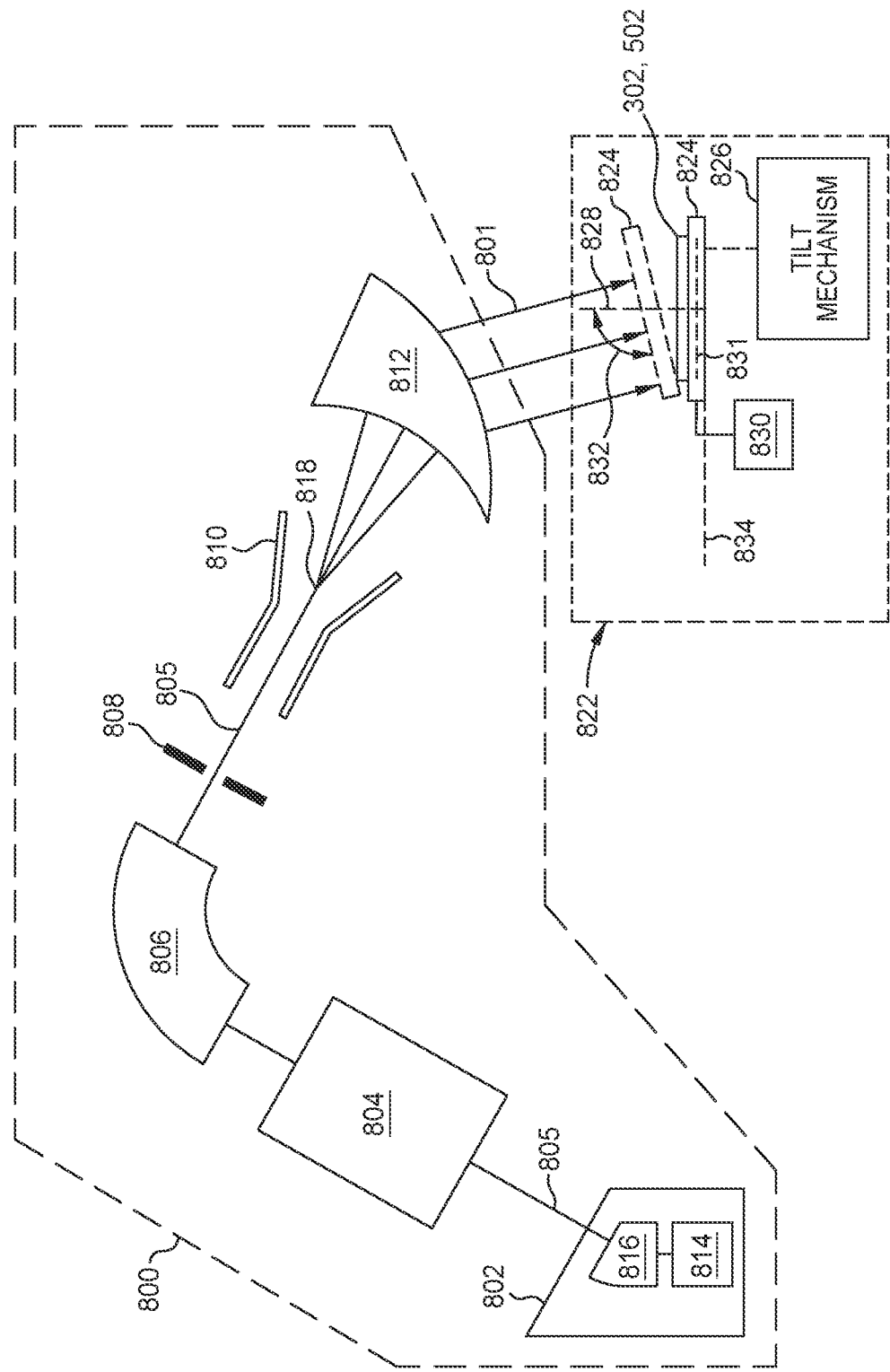
FIG. 2 is a schematic, block diagram of an ion beam generation system according to implementations described herein.

FIG. 2 is a schematic, block diagram of an ion beam generation system 800 paired with an implant station 822. The ion beam generation system 800 includes an ion source 802, an optional accelerator 804, a mass analyzer 806, a slit 808, a scanner 810, and an angle corrector 812. The ion source 802 includes an ion beam source 814 and a source filter 816. The source filter 816 is in close proximity to ion beam source 814. The source filter 816 is operable to emit an ion beam 805. The ion beam 805 is directed to the optional accelerator 804. The accelerator 804, when present, is positioned between the source filter 816 and the mass analyzer 806. The mass analyzer 806 includes a dipole analyzing magnet and the slit 808 having an aperture through which the ion beam 805 to passes after exiting the mass analyzer 806. The slit 808 removes portions of the ion beam 805 traveling in undesired directions, such that a well-defined beam 805 is provided to the scanner 810 from the mass analyzer 806.

The scanner 810, which may be an electrostatic scanner or a magnetic scanner or another suitable scanner, deflects the ion beam 805 to produce a deflected ion beam 801 having ion trajectories which diverge from a scan origin 818. The angle corrector 812 deflects the scanned ion beam 805 such that the deflected ion beams 801 exiting the angle corrector 812 are essentially parallel. The angle corrector 812 includes a magnet for deflecting the scanned ion beam 805 and producing the deflected ion beam 801. The angle corrector 812 is configured to deflect ions in the scanned ion beam 805 such that the deflected ion beams 801 have parallel ion trajectories traveling in a predefined direction as the deflected ion beams 801 exits the angle corrector 812. The angle corrector 812 or other component(s) of the ion beam generation system 800 may be moved or rotated to set the predefined direction (i.e., trajectory) of the deflected ion beams 801 towards an implant station 822 in which the substrate 302 is supported.

The implant station 822 includes a platen 824 that supports a substrate 302, 502 in the path of deflected ion beam 801 such that ions are implanted into the an amorphous carbon hardmask or other films that may be disposed on the substrate 302, 502. The implant station 822 further includes a tilt mechanism 826 for tilting the platen 824 with respect to trajectory of the deflected ion beam 801. In one embodiment, the tilt mechanism 826 may tilt the wafer support platen 824 with respect to two horizontal axes that are orthogonal. One horizontal axis 834 is depicted in FIG. 2, with the other horizontal axis extending normally into the page. An axis 828 is normal to a top surface of the platen 824. The axis 828 is rotated relative to the horizontal plane as the platen 824 is tilted. The platen 824 includes one or more heaters 831 coupled to a heating source 830. The heating source 830 enables the temperature of the substrate 302 to be elevated during the implantation process. In some implementations, which can be combined with other embodiments described herein, the heaters 831 are embedded in the platen 824.

The deflected ion beam 801 is directed toward the platen 824 at a tilt angle 832. The tilt angle 832 is defined between the axis 828 extending in a normal direction from a top surface of the platen 824 and a direction (e.g., trajectory) of the deflected ion beam 801 emitted from the angle corrector 812. As shown in FIG. 2, the tilt angle 832 is an acute angle. In another example, the platen 824 shown in phantom forms a tilt angle 832 of zero.

One or both of the ion beam generation system 800 or platen 824 is movable relative to the horizontal axes 834 such that the tilt angle 832 of the scanned ion beams 801 can be controlled as desired. The angle of incidence is controlled by controlling the tilt angle 832. In one example, the platen 824 is tilted with respect to two orthogonal horizontal axes 834 while the trajectory direction of the scanned ion beams 801 remain stationary. In another example, the direction of trajectory of the scanned ion beams 801 emitted from the ion beam generation system 800 may be changed relative to the surface of the platen 824 by adjusting the trajectory direction of the scanned ion beams 801 while keeping the platen 824 stationary.

Figure 3:
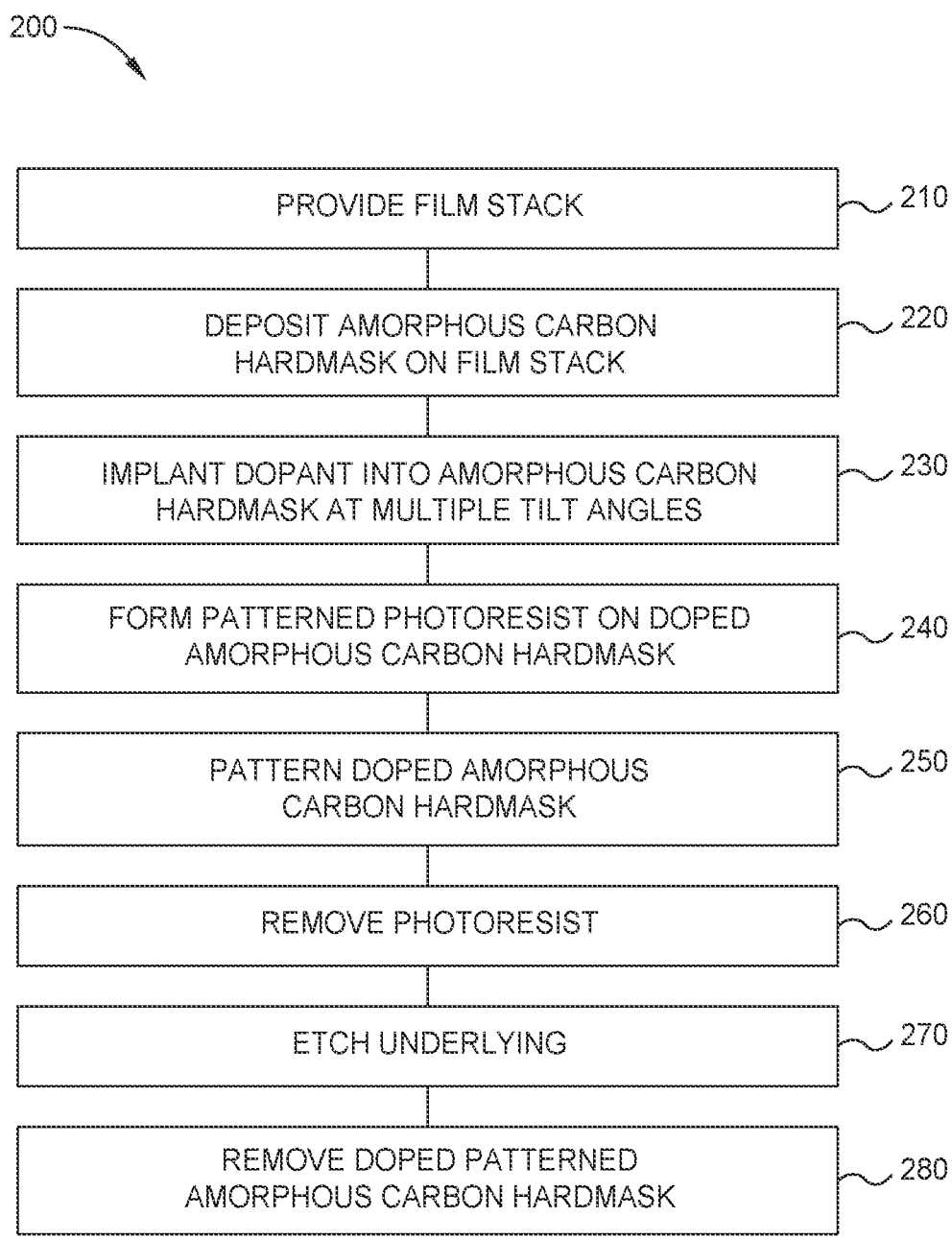
FIG. 3 depicts a process flow diagram of a method for forming an amorphous carbon hardmask layer on a film stack disposed on a substrate according to implementations described herein.

FIG. 3 depicts a process flow diagram of a method 200 for forming an amorphous carbon hardmask layer on a film stack disposed on a substrate in accordance with one or more implementations of the present disclosure. FIGS. 4A-4K depict a schematic cross-sectional view of a substrate structure illustrating a hardmask formation sequence according to the method 200. Although the method 200 is described below with reference to a hardmask layer that may be formed on a film stack utilized to manufacture stair-like structures in the film stack for three dimensional semiconductor devices, the method 200 may also be used to advantage in other device manufacturing applications. Further, it should also be understood that the operations depicted in FIG. 3 may be performed simultaneously and/or in a different order than the order depicted in FIG. 3.

Figure 4A:
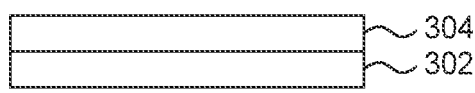
FIGS. 4A-4K depict a schematic cross-sectional view of a substrate structure illustrating a hardmask formation sequence according to implementations described herein.
Figure 4E:
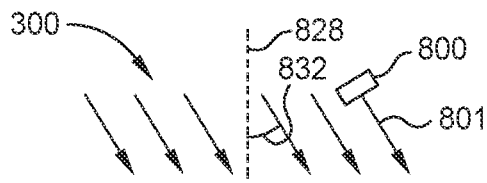

At operation 210, as shown in FIG. 4A, a substrate 302 is positioned into a process chamber, such as the plasma-processing chamber 100 depicted in FIG. 1. The substrate 302 may be the substrate 110 depicted in FIG. 1. The substrate 302 may be part of a film stack 300 formed thereon.

In one implementation, a surface of the substrate 302, as shown in FIG. 1, is substantially planar. Alternatively, the substrate 302 may have patterned structures, for example, a surface having trenches, holes, or vias formed therein. The substrate 302 may also have a substantially planar surface having a structure formed thereon or therein at a targeted elevation. While the substrate 302 is illustrated as a single body, it is understood that the substrate 302 may contain one or more materials used in forming semiconductor devices such as metal contacts, trench isolations, gates, bitlines, or any other interconnect features.

The film stack 300 includes the substrate 302 and an underlayer 304. The underlayer 304, as utilized herein, includes any layer, which is disposed beneath an amorphous carbon hardmask. For example, the amorphous carbon hardmask 306 may be disposed directly above the underlayer 304, such that the amorphous carbon hardmask 306 and underlayer 304 are in physical contact with each other. In one implementation, the underlayer 304 includes a single layer. In another implementation, the underlayer 304 includes a dielectric stack.

Figure 4B:
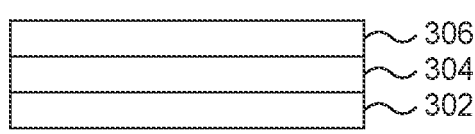
Figure 4F:
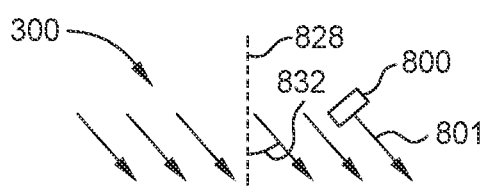
Figure 4C:
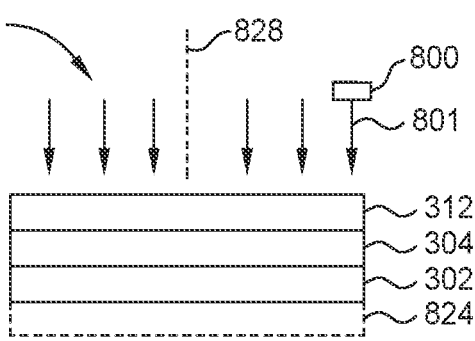

At operation 220, the amorphous carbon hardmask 306 is deposited. The amorphous carbon hardmask 306 is formed on the underlayer 304 disposed over the substrate 302, as illustrated in FIG. 4B. The amorphous carbon hardmask 306 is deposited by a blanket deposition process over the underlayer 304. The amorphous carbon hardmask 306 may be deposited to a thickness, which corresponds to the subsequent etching requirements of the underlayer 304. In one example, the amorphous carbon hardmask has a thickness of less than 10 µm. For example, between about 0.5 µm and about 1.5 µm, such as about 1.0 µm.

At operation 230, a directional ion implantation process at multiple tilt angles dopes the amorphous carbon hardmask 306, as illustrated in FIGS. 4C-4F. The operation 230 may be performed with the ion beam generation system 800, shown in FIG. 2. FIGS. 4C-4F depict examples of the ion implantation at different tilt angles 832. The ion implantation process dopes the amorphous carbon hardmask 306 with a dopant having a predefined trajectory (ion direction)

from the ion beam generation system 800 to form a doped amorphous carbon hardmask 312.

The ion implantation process is provided via the ion beam generation system 800 configured to accelerate the deflected ion beam 801 along the predefined trajectory (i.e., direction). In one implementation, the ion beam generation system 800 utilizes a beamline implantation technique employed to implant dopants. The substrate 302 sits on the platen 824. The angle of incidence of the scanned ion beams 801 to the surface of the amorphous carbon hardmask 306 can be controlled as desired. The angle of incidence is controlled by controlling the tilt angle 832. For example, the platen 824 is tilted relative to orthogonal horizontal axes 834 to change the tilt angle 832. As such, the substrate 302 is tilted relative to a horizontal axis 834 and the angle of incidence of the scanned ion beams 801 is changed. The tilt angle 832 is between about 0° and about 60°.

As shown in FIGS. 4C-4F, the tilt angle 832 can change for each subsequent ion implantation. To facilitate explanation, FIGS. 4C-4F are depicted with the top surface of the platen 824 substantially horizontal, however, it is contemplated that the platen 824 may actually be tilted relative to orthogonal horizontal axes 834 by the tilt mechanism 826 (see FIG. 2).

Multiple ion implants can be performed subsequently. The tilt angle 832 can be adjusted for each ion implant. For example, subsequent ion implant processes include tilt angles 832 of 0° (shown in FIG. 3C), 34° (shown in FIG. 3D), 48° (shown in FIG. 3E), and 60° (shown in FIG. 3F). An ion implant process is defined as an ion implantation process at a certain tilt angle 832. In the schematic illustration, scanned ion beams 801 bombard the amorphous carbon hardmask 306 at multiple tilt angles 832. In one implementation, which can be combined with other implementations described herein, the platen 824 is tilted while the trajectory direction of the scanned ion beams 801 remains stationary. As such, the tilt angle 832 corresponds to the angle of incidence on the amorphous carbon hardmask 306 of the scanned ion beams 801 emitted from the ion beam generation system 800.

Although FIGS. 4C-4F depict four different ion implant processes at four different tilt angles 832, the ion implant process is not limited to four implants and is not limited to four different tilt angles. As such, the ion implant process can include more or less than four ion implant processes. The number of tilt angles is not limited and is determined based on the desired dopant profile.

The scanned ion beams 801 generally penetrate the amorphous carbon hardmask 306 to form the doped amorphous carbon hardmask 312 implanted with the dopant. The scanned ion beams 801 penetrate the amorphous carbon hardmask 306 to various depths depending on the tilt angle 832 of the scanned ion beams 801. As such, a dopant profile can be formed by implanting the ions at different tilt angles 832. A dopant profile is a measurement of the concentration of the dopant with respect to the depth of the ion implant in the doped amorphous carbon hardmask 312. For example, the dopant profile may be a box profile. A box profile is a type of profile that has a maximum dopant concentration over a large depth range. By using multiple tilt angles 832 to dope the amorphous carbon hardmask 306, an evenly distributed dopant profile can be formed without changing the implant energy for each ion implant process.

Suitable ion species may be generated from various precursor materials, such as carbon, boron, nitrogen, silicon, phosphorous, helium, argon, neon, aluminum, sulfur, krypton, xenon, beryllium, and germanium containing materials.

In one implementation, the dopant is selected from carbon, boron, nitrogen, silicon, phosphorous, helium, argon, neon, aluminum, sulfur, krypton, xenon, beryllium, tin, silicon, indium, lanthanum, antimony, tungsten, and germanium, or a combination of two or more of the above. The species of scanned ion beams 801 may be tailored to provide a decrease in the etch rate of the amorphous carbon hardmask 306 without affecting etch selectivity of the underlayer 304. As such, the implanted species may be any monomer or molecular ion that is adapted to enhance etch selectivity of the amorphous carbon hardmask 306.

In one implementation, the ion implantation process implants a dopant into the amorphous carbon hardmask 306. The implant energy utilized to energize the dopant is between about 10 keV and about 900 keV. The implant energy will remain substantially constant during the implantation process. The implant energy utilized to energize the dopant ions will be determined by the type of dopant utilized, the type of material utilized as the amorphous carbon hardmask 306 and the depth of implantation targeted.

In one implementation, the ion dosage (ions/cm$^2$) is between about $1\times10^{12}$ ions/cm$^2$ and about $5\times10^{15}$ ions/cm$^2$ (e.g., between about $1\times10^{14}$ ions/cm$^2$ and about $3\times10^{15}$ ions/cm$^2$; between about $5\times10^{14}$ ions/cm$^2$ and about $2\times10^{15}$ ions/cm$^2$;) depending on the type of dopant utilized, the type of material utilized as the amorphous carbon hardmask 306 and the depth of implantation targeted. In one implementation, the target temperature is between about −100 degrees Celsius and about 700 degrees Celsius, such as between 400 degrees Celsius and about 600 degrees Celsius. The ion implantation is a hot implant.

In general, increased hardness of the amorphous carbon hardmask 306 provides for reduced line bending of high aspect ratio structures in the underlayer 304 after the amorphous carbon hardmask 306 is opened. It is believed that the implanted scanned ion beams 801 abstract residual hydrogen atoms from the dangling carbon-hydrogen bonds of the amorphous carbon hardmask 306 and form a carbide structure within the amorphous carbon hardmask 306. The carbide structure exhibits increased hardness when compared to an undoped hardmask. Additionally, it is believed the implanted scanned ion beams 801 occupy interstitial voids present within the amorphous carbon hardmask 306, which results in an increased density of the amorphous carbon hardmask 306. The increased density further increases the mechanical integrity of the amorphous carbon hardmask 306.

In one implementation, subsequent to the ion implantation process, the film stack 300 is thermally treated. Suitable post-ion implant thermal treatment techniques include UV treatment, thermal annealing, and laser annealing. The thermal treatment of the doped amorphous carbon hardmask 312 further incorporates the implanted scanned ion beams 801 into the framework of the doped amorphous carbon hardmask 312. For example, the implanted scanned ion beams 801 may be redistributed within the doped amorphous carbon hardmask 312 for form a more uniform doping profile. It is believed the thermal treatment may increase interaction and bonding between the amorphous carbon of the doped amorphous carbon hardmask 312 and the implanted scanned ion beams 801. The redistribution and bonding of the implanted scanned ion beams 801 may function to further increase the hardness, density, and etch selectivity of the doped amorphous carbon hardmask 312. In one implementation, the anneal process is performed in a plasma-processing chamber, such as the plasma-processing chamber 100. In another implementation, the anneal process is performed in a separate anneal chamber.

Figure 4G:
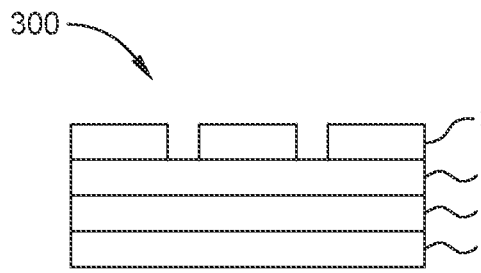
Figure 4D:
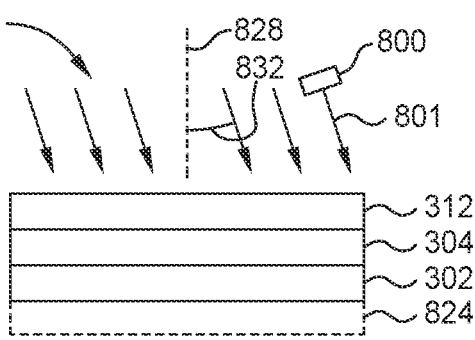

At operation 240, a photoresist layer 320, which is patterned, is formed over the doped amorphous carbon hardmask 312 doped with the dopant, as illustrated in FIG. 4G. Features or patterns may be transferred to the photoresist layer 320 from a photomask utilizing an energy source, such as light energy. In one implementation, the photoresist layer 320 is a polymeric material and the patterning process is performed by a 193-nanometer immersion photolithography process, or other similar photolithography process. Similarly, lasers may also be utilized to perform the patterning process.

Figure 4H:
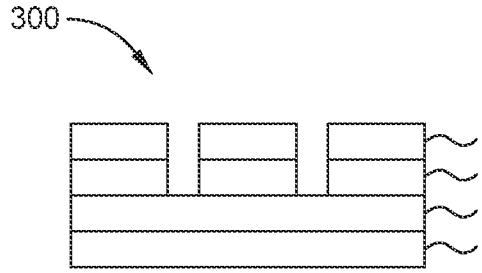

At operation 250, the doped amorphous carbon hardmask 312 is opened by, for example, a plasma etching process to form a doped patterned amorphous carbon hardmask 322 as illustrated in FIG. 4H. The plasma etching process may be performed in a chamber similar to the chambers described with regard to FIGS. 4C-4F.

Figure 4I:
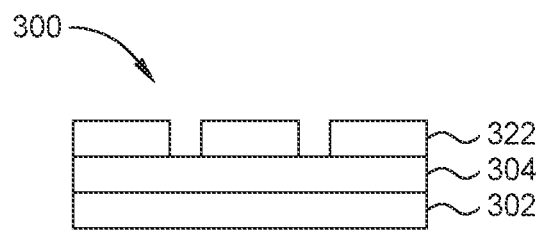

At operation 260, the photoresist layer 320 is removed as illustrated in FIG. 4I. The photoresist layer 320 may be removed by various advantageous photoresist removal processes.

Figure 4J:
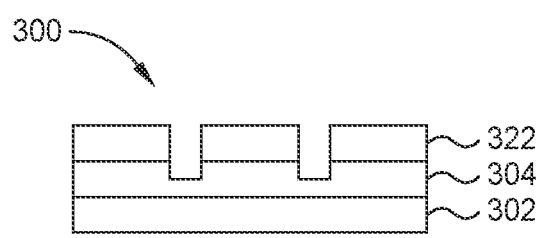
Figure 4K:
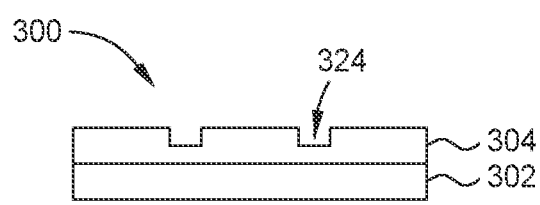

At operation 270, the underlayer 304 is etched, as illustrated in FIG. 4J. The underlayer 304 etching may be performed in a plasma-processing chamber, such as the chambers and systems described with regard to FIG. 1. Etchants, such as fluorocarbons, remove the exposed portions of the underlayer 304. The active species of the etchants are substantially unreactive with the materials of the doped patterned amorphous carbon hardmask 322. Thus, the etchants are selective for the underlayer 304 material. Suitable examples of etchants include $CH_4$, COS, $N_2$, $O_2$, $C_4F_6$, $CF_4$, $CHF_3$, $CH_2F_2$, HBr, $BCl_3$, $SF_6$, $H_2$, and $Cl_2$ among others. The etchants may be provided with an inert carrier gas. The underlayer 304 may be etched through the doped patterned amorphous carbon hardmask 322.

At operation 280, the doped patterned amorphous carbon hardmask 322 is removed. The doped patterned amorphous carbon hardmask 322 may be removed by any advantageous hardmask removal process. In one example, oxygen plasma is utilized to remove the doped patterned amorphous carbon hardmask 322. The resulting film stack 300 includes the underlayer 304 having a feature 324, such as a high aspect ratio feature, formed therein. The film stack 300 may then be subjected to further processing to form a functional semiconductor device.

Figure 5:
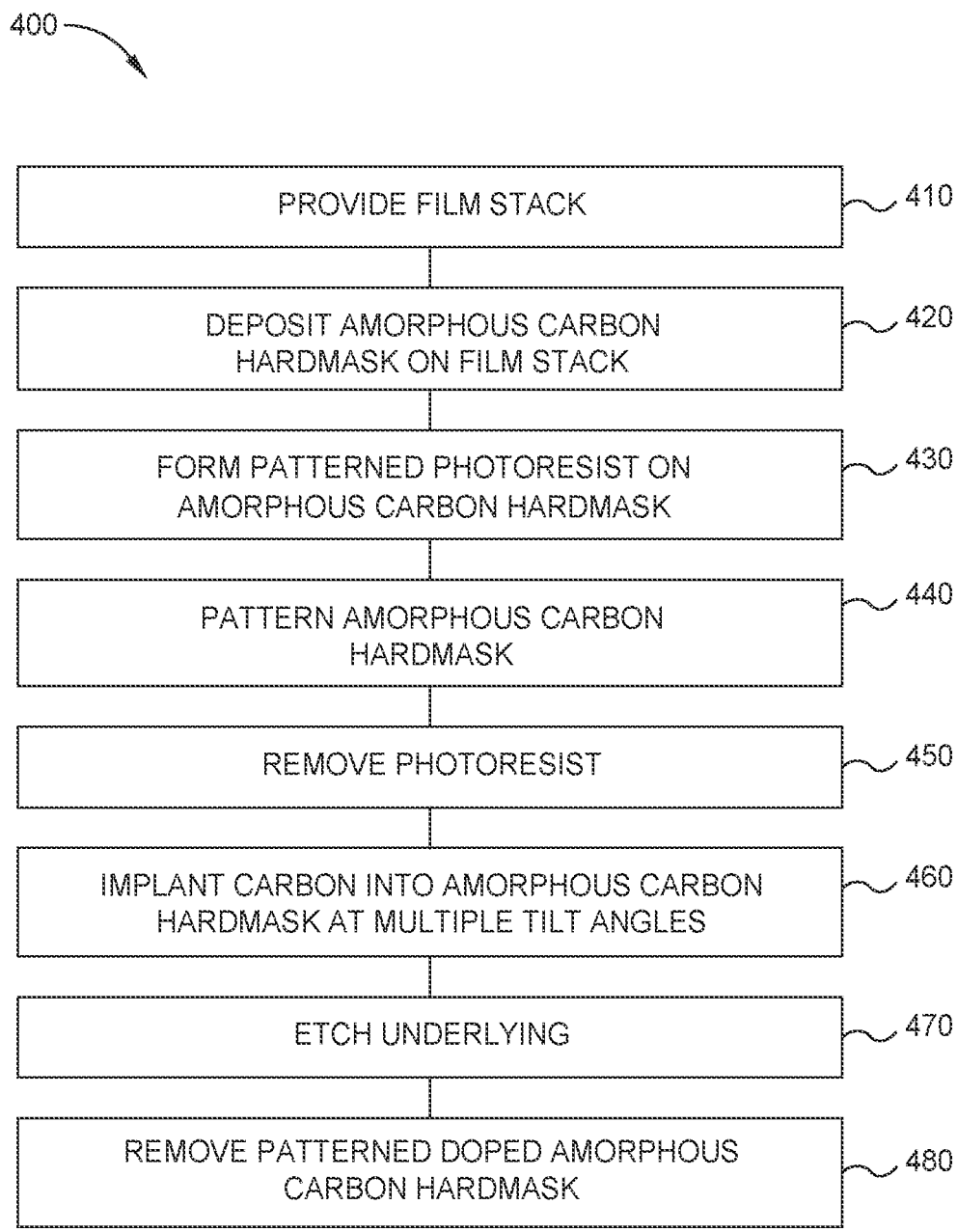
FIG. 5 depicts a process flow diagram of a method for forming an amorphous carbon hardmask layer on a film stack disposed on a substrate according to implementations described herein.

FIG. 5 depicts a process flow diagram of a method 400 for forming an amorphous carbon hardmask layer on a film stack disposed on a substrate in accordance with one or more implementations of the present disclosure. FIGS. 6A-6K depict a schematic cross-sectional view of a substrate structure illustrating a hardmask formation sequence according to method 400. The method 400 and FIGS. 6A-6K depict a post-patterning implant, where the amorphous carbon film is implanted after patterning the amorphous carbon film. Although the method 400 is described with reference to a hardmask layer that may be formed on a film stack utilized to manufacture stair-like structures in the film stack for three dimensional semiconductor devices, the method 400 may also be used to advantage in other device manufacturing applications. Further, it should also be understood that the operations depicted in FIG. 5 may be performed simultaneously and/or in a different order than the order depicted in FIG. 5.

Figure 6A:
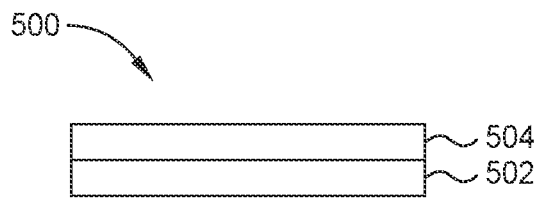
FIGS. 6A-6K depict a schematic cross-sectional view of a substrate structure illustrating a hardmask formation sequence according to implementations described herein.

At operation 410, as shown in FIG. 6A, a substrate 502 is positioned into a process chamber, such as the plasma-processing chamber 100 depicted in FIG. 1. The substrate 502 can be the substrate 110 depicted in FIG. 1. The substrate 502 can be part of a film stack 500 having additional layers formed thereon.

In one implementation, a surface of the substrate 502, as shown in FIG. 1, is substantially planar. Alternatively, the substrate 502 may have patterned structures, for example, a surface having trenches, holes, or vias formed therein. The substrate 502 may also have a substantially planar surface having a structure formed thereon or therein at a targeted elevation. While the substrate 502 is illustrated as a single body, it is understood that the substrate 502 may contain one or more materials used in forming semiconductor devices such as metal contacts, trench isolations, gates, bitlines, or any other interconnect features.

The film stack 500 includes the substrate 502 and an underlayer 504. The underlayer 504, as utilized herein, includes any layer, which is disposed beneath an amorphous carbon hardmask. For example, the amorphous carbon hardmask 506 may be disposed directly above the underlayer 504, such that the amorphous carbon hardmask 506 and underlayer 504 are in physical contact with each other. In one example, the underlayer 504 includes a single layer. In another example, the underlayer 504 includes multiple layers such as a dielectric stack.

Figure 6B:
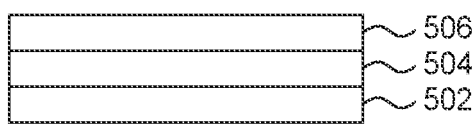

At operation 420, the amorphous carbon hardmask 506 is deposited. The amorphous carbon hardmask 506 is formed on the underlayer 504 disposed over the substrate 502, as illustrated in FIG. 6B. The amorphous carbon hardmask 506 can be deposited by a blanket deposition process over the underlayer 504. In some implementations, the amorphous carbon hardmask 506 is deposited according to the method 400 described in the process flow diagram of FIG. 5. The amorphous carbon hardmask 506 may be deposited to a thickness, which corresponds to the subsequent etching requirements of the underlayer 504. In one example, the amorphous carbon hardmask 506 has a thickness of less than 10 μm. For example, between about 0.5 μm and about 1.5 μm, such as about 1.0 μm.

Figure 6C:
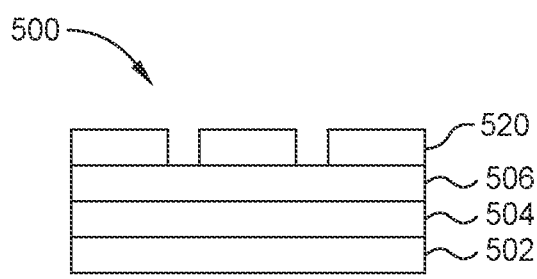

At operation 430, a photoresist layer 520, which is patterned, is formed over the amorphous carbon hardmask 506, as illustrated in FIG. 6C. Features or patterns may be transferred to the photoresist layer 520 from a photomask utilizing an energy source, such as light energy. In one implementation, the photoresist layer 520 is a polymeric material and the patterning process is performed by a 193-nanometer immersion photolithography process, or other similar photolithography process. Similarly, lasers may also be utilized to perform the patterning process.

Figure 6D:
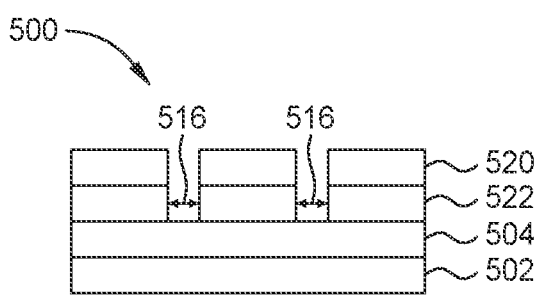

At operation 440, the amorphous carbon hardmask 506 is opened by, for example, a plasma etching process to form a patterned amorphous carbon hardmask 522 having openings or apertures defined by a diameter 516 as illustrated in FIG. 6D. Any suitable plasma etching process can be used.

Figure 6E:
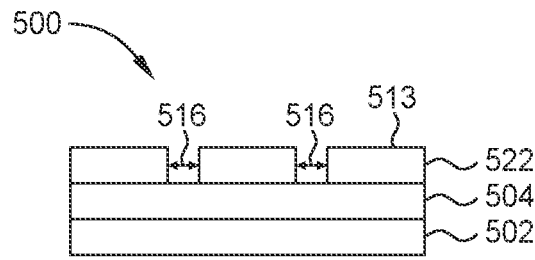
Figure 6F:
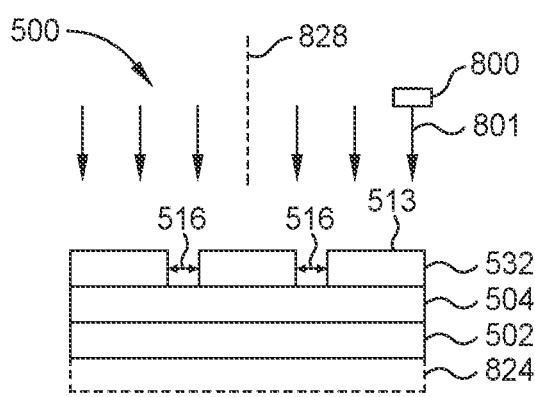
Figure 6G:
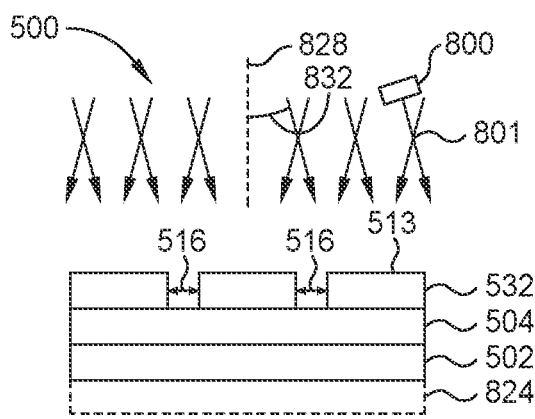
Figure 6H:
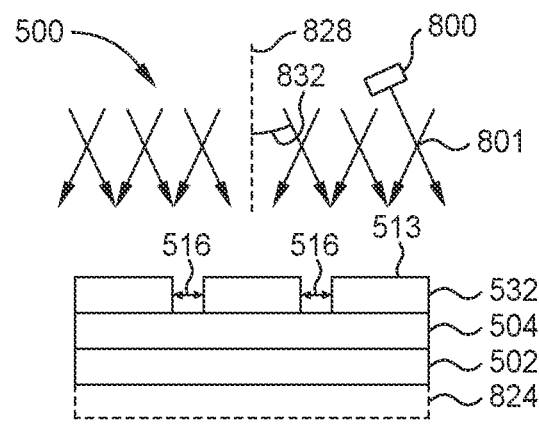
Figure 6I:
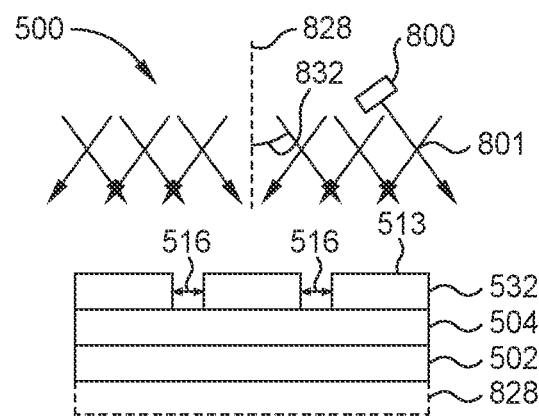

At operation 450, the photoresist layer 520 is removed to exposed a top surface 513 of the patterned amorphous carbon hardmask 522 as illustrated in FIG. 6E. The photoresist layer 520 may be removed by any suitable photoresist removal processes.

At operation 460, a directional ion implantation process at multiple tilt angles dopes the patterned amorphous carbon hardmask 522, as illustrated in FIGS. 6F-6I. The operation 460 may be performed with the ion beam generation system 800, shown in FIG. 2. FIGS. 6F-6I depict examples of the ion implantation at different tilt angles 832. The ion implantation process dopes the patterned amorphous carbon hardmask 522 with a dopant having a predefined trajectory (ion direction) from the ion beam generation system 800 to form a doped patterned amorphous carbon hardmask 532.

The ion implantation process is provided via the ion beam generation system 800 configured to accelerate the deflected ion beam 801 along the predefined trajectory (i.e., direction). In one implementation, the ion beam generation system 800 utilizes a beamline implantation technique employed to implant dopants. The angle of incidence of the scanned ion beams 801 to the surface of the patterned amorphous carbon hardmask 522 can be controlled as desired. The angle of incidence is controlled by controlling the tilt angle 832. For example, the platen 824 is tilted relative to orthogonal horizontal axes 834 to change the tilt angle 832. As such, the substrate 502 is tilted relative to a horizontal axis 834 and the angle of incidence of the scanned ion beams 801 is changed. The tilt angle 832 is between about 0° and about 60°.

As shown in FIGS. 6F-6I, the tilt angle 832 can change for each subsequent ion implantation. To facilitate explanation, FIGS. 6F-6I are depicted with the top surface of the platen 824 substantially horizontal, however, it is contemplated that the platen 824 may actually be tilted relative to orthogonal horizontal axes 834 by the tilt mechanism 826 (see FIG. 2).

Multiple ion implants can be performed subsequently. The tilt angle 832 can be adjusted for each ion implant. For example, subsequent ion implant processes include tilt angles 832 of 0° (shown in FIG. 6F), 34° (shown in FIG. 6G), 48° (shown in FIG. 6H), and 60° (shown in FIG. 6I). An ion implant process is defined as an ion implantation process at a certain tilt angle 832. In the schematic illustration, scanned ion beams 801 bombard the patterned amorphous carbon hardmask 522 at multiple tilt angles 832. In one implementation, which can be combined with other implementations described herein, the platen 824 is tilted while the trajectory direction of the scanned ion beams 801 remains stationary. As such, the tilt angle 832 corresponds to the angle of incidence on the amorphous carbon hardmask 306 of the scanned ion beams 801 emitted from the ion beam generation system 800.

Although FIGS. 6F-6I depict four different ion implant processes at four different tilt angles 832, the ion implant process is not limited to four implants and is not limited to four different tilt angles. As such, the ion implant process can include more or less than four ion implant processes. The number of tilt angles is not limited and is determined based on the desired dopant profile.

The tilt angle 832 generally depends on the diameter 516 of the opening in the patterned amorphous carbon hardmask 522. The tilt angles 832 are adjusted such that the scanned ion beams 801 penetrate sidewalls 517 of the openings defined by the diameter 516. The ion implantation process must be performed with between 2 and 16 orientation angles of the substrate 110. During each ion implant process at a predetermined tilt angle 832, the orientation angle, as depicted in FIGS. 6F-6I, will be rotated 180°. As such, the orientation angle for each ion implant process is performed at equal but opposite orientation angles as the substrate 502 is reoriented with each ion implant process to ensure equal doping. The orientation angle is adjusted by rotating the substrate 502 about the axis 828. The orientation angle is between 0° and about 360°. The ion implantation can be divided into multiple implants, with each implant performed at a different tilt angle 832 and a different rotation angle.

In the schematic illustrations of FIG. 6F-6I, scanned ion beams 801 bombard the patterned amorphous carbon hardmask 522 at the tilt angle 832 to generally penetrate the patterned amorphous carbon hardmask 522 and exposed portions of the underlayer 504 to form the doped patterned amorphous carbon hardmask 532. The scanned ion beams 801 penetrate the patterned amorphous carbon hardmask 522 and the underlayer 504 to various depths depending on the tilt angle 832. As such, a dopant profile can be formed by implanting the ions at different tilt angles 832. For example, a box dopant profile may be formed. By using multiple tilt angles 832 to dope the patterned amorphous carbon hardmask 522, an evenly distributed dopant profile can be formed without changing the implant energy for each ion implant process. Alternately, the implantation process may be performed at a tilt angle 832 such that the exposed portions of the underlayer 504 are not modified or doped. The tilt angle 832 depends on the diameter 516 of the opening.

Suitable ion species may be generated from various precursor materials, such as carbon, boron, nitrogen, silicon, phosphorous, helium, argon, neon, aluminum, sulfur, krypton, xenon, beryllium, and germanium containing materials. In one implementation, the dopant is selected from carbon, boron, nitrogen, silicon, phosphorous, helium, argon, neon, aluminum, sulfur, krypton, xenon, beryllium, germanium or a combination thereof. The species of scanned ion beams 801 may be tailored to provide a decrease in the etch rate of the amorphous carbon hardmask 506 without affecting etch selectivity of the underlayer 504.

As such, the implanted species can be any monomer or molecular ion that is adapted to enhance etch selectivity of the patterned amorphous carbon hardmask 522.

In one implementation, the implant energy utilized to energize the dopant is between about 10 keV and about 900 keV. The implant energy will remain substantially constant during the implantation process. The implant energy utilized to energize the dopant ions will be determined by the type of dopant utilized, the type of material utilized as the patterned amorphous carbon hardmask 522 and the depth of implantation targeted.

In one implementation, the ion dosage (ions/cm$^2$) is between about $1\times10^{12}$ ions/cm$^2$ and about $5\times10^{15}$ ions/cm$^2$ (e.g., between about $1\times10^{14}$ ions/cm$^2$ and about $3\times10^{15}$ ions/cm$^2$; between about $5\times10^{14}$ ions/cm$^2$ and about $2\times10^{15}$ ions/cm$^2$;) depending on the type of dopant utilized, the type of material utilized as the amorphous carbon hardmask 306 and the depth of implantation targeted. In one implementation, the target temperature is between about −100 degrees Celsius and about 700 degrees Celsius, such as between 400 degrees Celsius and about 600 degrees Celsius. The ion implantation is a hot implant.

In one implementation, subsequent to the ion implantation process, the film stack 500 is thermally treated. Suitable post-ion implant thermal treatment techniques include UV treatment, thermal annealing, and/or laser annealing. The thermal treatment of the doped patterned amorphous carbon hardmask 532 further incorporates the implanted scanned ion beams 801 into the framework of the doped patterned amorphous carbon hardmask 532. For example, the implanted scanned ion beams 801 may be redistributed within the doped patterned amorphous carbon hardmask 532 to form a more uniform doping profile. It is believed the thermal treatment may increase interaction and bonding between the amorphous carbon of the doped patterned amorphous carbon hardmask 532 and the implanted scanned ion beams 801. The redistribution and bonding of the implanted scanned ion beams 801 can function to further increase the hardness, density, and etch selectivity of the doped patterned amorphous carbon hardmask 532. In one implementation, the anneal process is performed in a plasma-processing chamber, such as the plasma-processing chamber 100. In another implementation, the anneal process is performed in a separate anneal chamber.

In general, increased hardness of the doped patterned amorphous carbon hardmask 532 provides for reduced line bending of high aspect ratio structures in the underlayer 504. It is believed that the implanted scanned ion beams 801 abstract residual hydrogen atoms from the dangling carbon-hydrogen bonds of the amorphous carbon hardmask 506 and form a carbide structure within the amorphous carbon hardmask 506. The carbide structure exhibits increased hardness when compared to an undoped hardmask. Additionally, it is believed the implanted scanned ion beams 801 occupy interstitial voids present within the doped patterned amorphous carbon hardmask 532, which results in an increased density of the doped patterned amorphous carbon hardmask 532. Additionally, it is believed the implanted scanned ion beams 801 increase the formation of $SP^3$ carbon to carbon bonds in the amorphous carbon hardmask 506. The increased density further increases the mechanical integrity of the doped patterned amorphous carbon hardmask 532.

Figure 6J:
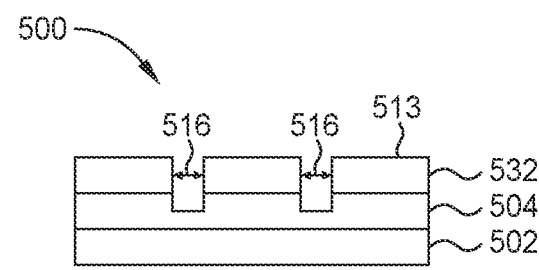

At operation 470, the underlayer 504 is etched, as illustrated in FIG. 6J. The underlayer 504 etching is performed in a plasma-processing chamber, such as the chambers and systems described with regard to FIG. 1. Etchants, such as fluorocarbons, remove the exposed portions of the underlayer 504. The active species of the etchants are substantially unreactive with the materials of the doped patterned amorphous carbon hardmask 532. Thus, the etchants are selective for the underlayer 504 material. Suitable examples of etchants include $CF_4$, $CHF_3$, HBr, $BCl_3$, and $Cl_2$ among others. The etchants may be provided with an inert carrier gas. The underlayer 504 is etched through the doped patterned amorphous carbon hardmask 532.

Figure 6K:
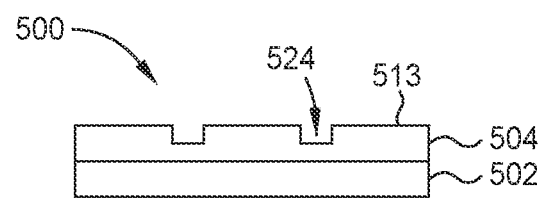

At operation 480, the doped patterned amorphous carbon hardmask 532 is removed as illustrated in FIG. 6K. The doped patterned amorphous carbon hardmask 532 may be removed by any advantageous hardmask removal process. In one example, oxygen plasma is utilized to remove the doped patterned amorphous carbon hardmask 532. The resulting film stack 500 includes the underlayer 504 having a feature 524, such as a high aspect ratio feature, formed therein. The film stack 500 may then be subjected to further processing to form a functional semiconductor device.

Figure 7A:
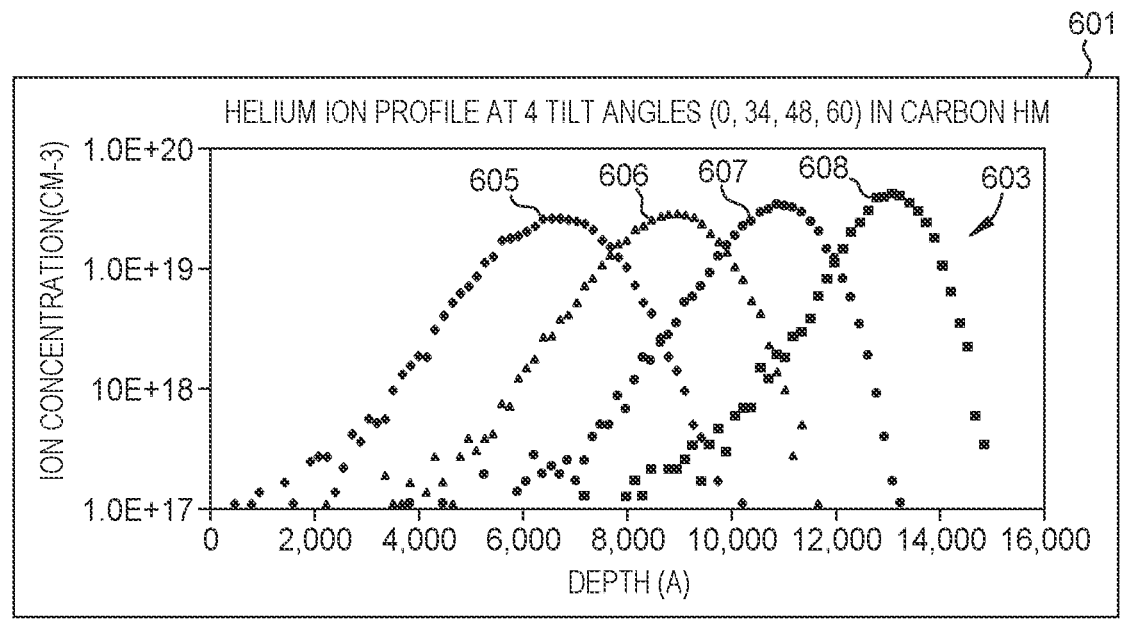
FIG. 7A is a chart of a first dopant profile according to implementations described herein.

FIG. 7A is a chart 601 of a dopant profile 603. The chart 601 shows an ion implant simulation result of helium dopant concentration relative to depth into the carbon hardmask after the method 200 or the method 400. The chart 601 depicts the relationship between a depth (A) of the ion implant into the amorphous carbon hardmask and the dopant concentration ($cm^{-3}$). A first data set 605 is implanted at a tilt angle of 60 degrees. A second data set 606 is implanted at a tilt angle of 48 degrees. A third data set 607 is implanted at a tilt angle of 34 degrees. A fourth data set 608 is implanted at a tilt angle of 0 degrees. As such, the dopant profile changes depending on the tilt angle of the ion implant process.

It is also contemplated that in either of the methods 200, 400 described above, the dopants utilized at different incident (tilt) angles may be the same or different. For example, the patterned amorphous carbon hardmask may be doped by performing a first ion implant processes of a first dopant into the patterned amorphous carbon hardmask at a first angle of ion incidence, then performing a second ion implant processes of a second dopant into the patterned amorphous carbon hardmask at a second angle of ion incidence that is different than the second angle of incidence.

Figure 7B:
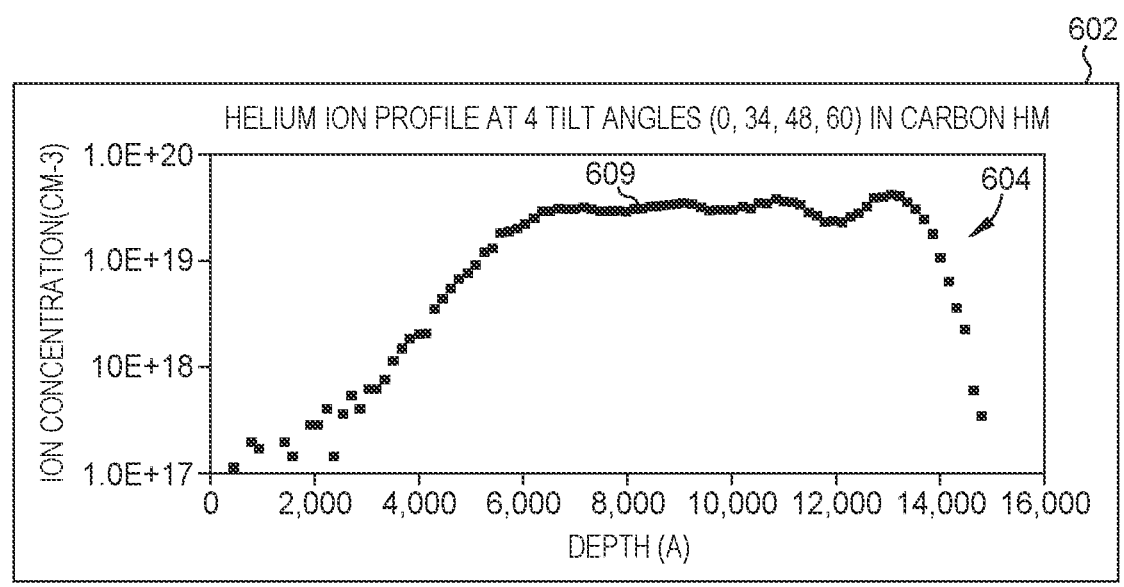
FIG. 7B is a chart of a second dopant profile according to implementations described herein.

FIG. 7B is a chart 602 of a dopant profile 603. The chart 602 shows the sum of the results of chart 601. The charts 601,602 show the same helium ion dopant profile 603. The chart 602 includes the results of helium dopant concentration relative to depth into the carbon hardmask after the method 200 or the method 400. The dopant profile 603 is an example of a box profile. A fifth data set 609 is a summation of the ion concentration of the first data set 605, the second data set 606, the third data set 607, and the fourth data set 608 at each depth. As such, a box profile may be achieved by completing multiple ion implant processes at different tilt angles.

Figure 8:
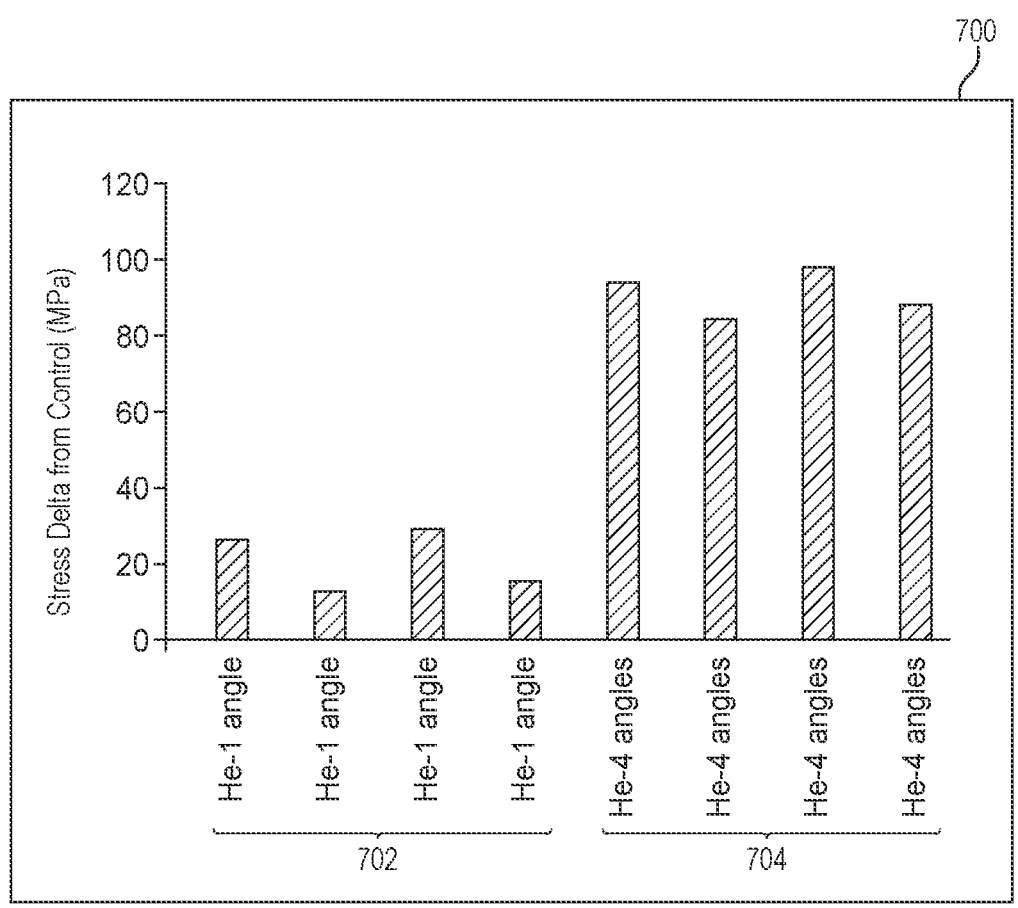
FIG. 8 is a chart of stress change of four test substrates relative to a substrate without ion implants, according to implementations described herein.

FIG. 8 is a chart 700 of stress change of four test substrates relative to a substrate without ion implants, according to implementations described herein. The chart 700 includes real stress data. Four substrates were exposed to a helium ion implant process, to dope an amorphous carbon hardmask disposed thereon. The stress delta for each substrate relative to an undoped carbon hardmask is shown in the chart 700.

The chart 700 includes a first section 702 and a second section 704. The first section 702 depicts the stress delta of four substrates after helium ion implant process at a single tilt angle. As shown, the stress delta ranges from about 10 MPa to about 30 MPa. The second section 704 depicts the stress delta of four substrates after helium ion implant processes at four different tilt angles. As shown, the stress delta ranges from about 80 MPa to about 100 MPa.

The chart 700 shows that the stress in an amorphous carbon hardmask is increased when implanted with helium ion implant at multiple tilt angles. The implant energy used to energize the helium ion is about 280 keV. The increase in stress delta in the hardmasks (increase in tensile stress) will improve etch selectivity of the hardmasks.

In summation, an improved hardmask layer and methods for depositing improved hardmask layer with ion implants at multiple tilt angles is described herein. By performing ion implantation at multiple tilt angles, an evenly distributed dopant profiled can be created. Implanting ions at multiple depths by altering the tilt angle results in a higher implant throughput, thus a lower cost of implant tool ownership than changing implant energies. Throughput will be improved by allowing the ion source to maintain the same energy while changing the tilt angle. Additionally, ion implantation will improve etch selectivity of the carbon-containing hardmask by about 10% to about 40% compared to other hardmask films, while also matching the previous overlay requirements.

Thus, methods for forming a highly etch selective amorphous carbon film with a ion implantation process at multiple tilt angles are described herein. The methods advantageously provide an amorphous carbon film with targeted mechanical properties, such as low stress and high Young's Modulus, changes in carbon-to-carbon bonding and hydrogen incorporation, as well as high etching selectivity. Implementations of the present disclosure further provide a process design that uses existing hardware with little impact to throughput or implementation cost. By only changing tilt angle, throughput is improved compared to other methods of forming a dopant profile via ion implantation.

While the foregoing is directed to implementations of the present disclosure, other and further implementations of the disclosure may be devised without departing from the basic scope thereof, and the scope thereof is determined by the claims that follow.

What is claimed is:

1. A method of forming a doped amorphous carbon hardmask, comprising:
- depositing an amorphous carbon hardmask on an underlayer positioned on a substrate;
- performing two or more ion implant processes to dope the amorphous carbon hardmask with a dopant to form the doped amorphous carbon hardmask, wherein at least two of the ion implant processes comprises at least a first ion implant process and a second ion implant process that are performed at different tilt angles and at a common implant energy level, the tilt angles defined between an axis extending in a normal direction from a top surface of a platen and a direction of an ion beam developed by the ion implant processes, the first ion implant process implanting dopants to a depth greater that that of the second ion implant process;
- patterning the doped amorphous carbon hardmask with a photoresist; and
- etching the underlayer through the doped amorphous carbon hardmask.

2. The method of claim 1, wherein the dopant is selected from at least one member of the group consisting of carbon, boron, nitrogen, silicon, phosphorous, helium, argon, neon, aluminum, sulfur, krypton, xenon, beryllium, tin, silicon, indium, lanthanum, antimony, tungsten, and germanium.

3. The method of claim 1, wherein a target temperature during implanting the dopant is between about −100 degrees Celsius and about 700 degrees Celsius.

4. The method of claim 1, wherein the tilt angle of one ion implant process is between about 0° and about 60°.

5. The method of claim 1, wherein a thickness of the amorphous carbon hardmask is less than about 10 µm.

6. The method of claim 1, wherein an implant energy utilized to energize the dopant is between about 10 keV and about 900 keV.

7. The method of claim 1, wherein the dopant is selected from at least one member of the group consisting of aluminum, sulfur, tin, silicon, indium, lanthanum, antimony, and tungsten.

8. The method of claim 1, wherein two or more ion implant processes include at least four ion implant processes, each of the four ion implant processes having a different tilt angle.

9. The method of claim 1, wherein performing the two or more ion implant processes further comprises:
- changing the direction of the ion beam between a first ion implant process and a second ion implant process of the two or more ion implant processes.

10. The method of claim 1, wherein performing the two or more ion implant processes further comprises:
- changing a tilt of the platen between a first ion implant process and a second ion implant process of the two or more ion implant processes.

11. The method of claim 1, wherein a thickness of the amorphous carbon hardmask is between 0.5 µm and 1.5 µm.

12. The method of claim 1, wherein performing the two or more ion implant produces an ion dosage (ions/cm$^2$) in the doped amorphous carbon hardmask of between about $1\times10^{12}$ ions/cm$^2$ and about $5\times10^{15}$ ions/cm$^2$.

13. The method of claim 1, wherein the doped amorphous carbon hardmask is substantially unreactive to fluorocarbon etchants.

* * * * *